United States Patent [19]

Hiiragizawa

[11] Patent Number: 5,941,990

[45] Date of Patent: *Aug. 24, 1999

[54] SEMICONDUCTOR INTEGRATED CIRCUIT HAVING VOLTAGE GENERATION CIRCUIT DRIVEN BY TWO DIFFERENT CLOCK SIGNALS

[75] Inventor: Yasunori Hiiragizawa, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/740,387

[22] Filed: Oct. 29, 1996

[30] Foreign Application Priority Data

Oct. 31, 1995 [JP] Japan ................................ 7-282923

[51] Int. Cl.⁶ ........................................................ G06F 1/32
[52] U.S. Cl. ........................... 713/310; 713/320; 713/322; 713/323; 713/324; 713/600; 713/601
[58] Field of Search .......................... 395/750.01–750.06; 365/189.01–233; 327/213, 544; 713/300, 310, 320, 322–324, 600, 601

[56] References Cited

U.S. PATENT DOCUMENTS

| 4,326,134 | 4/1982 | Owen et al. ............................ 307/268 |
| 4,393,481 | 7/1983 | Owen et al. ............................ 365/228 |
| 4,542,485 | 9/1985 | Iwahashi et al. ....................... 365/230 |
| 4,851,787 | 7/1989 | Martin .................................... 331/1 A |
| 4,905,199 | 2/1990 | Miyamoto .............................. 365/226 |
| 5,365,121 | 11/1994 | Morton et al. ......................... 327/170 |
| 5,371,705 | 12/1994 | Nakayama et al. ................. 365/189.09 |
| 5,381,366 | 1/1995 | Kawauchi et al. ................... 365/185 |
| 5,428,568 | 6/1995 | Kobayashi et al. .................. 365/185 |
| 5,535,160 | 7/1996 | Yamaguchi ....................... 365/189.01 |
| 5,550,489 | 8/1996 | Raab ....................................... 326/93 |
| 5,592,423 | 1/1997 | Tokami ................................. 365/221 |
| 5,627,488 | 5/1997 | Tanzawa et al. ..................... 327/261 |
| 5,629,897 | 5/1997 | Iwamoto et al. ..................... 365/195 |
| 5,668,762 | 9/1997 | Sawa ................................ 365/189.11 |
| 5,673,232 | 9/1997 | Furutani ............................... 365/226 |

*Primary Examiner*—Xuan M. Thai
*Attorney, Agent, or Firm*—Young & Thompson

[57] ABSTRACT

A semiconductor integrated circuit has a self-oscillation circuit 5 for generating an internal clock signal ICK, a frequency division circuit 6 for generating a divided clock signal DCK based on an external clock signal CK, a switching circuit 7 connected to the self-oscillation circuit 5 and a frequency division circuit 6 and selectively outputting one of the internally clock signal ICK and the divided clock signal DCK in response to a control signal STBY, a controller 3 connected to the self-oscillation circuit 5 and the frequency division circuit 6 and the switching circuit 7, receiving a mode signal, and outputting the control signal STBY in accordance with the mode signal, when the mode signal is in a standby mode state, the self-oscillation circuit 5 is stopped and the switching circuit 7 selects the divided clock signal DCK, when the mode signal is in a normal operating state, the switching circuit 7 selects the internally clock signal ICK, and a charge pump circuit 8 receiving one of the internal clock signal ICK and the divided clock signal DCK and generating a high voltage Vh when the internal clock signal ICK is supplied through the switching circuit 7, and a voltage Vha different from the high voltage Vh when the divided clock signal DCK is supplied through the switching circuit 7.

8 Claims, 5 Drawing Sheets

SEMICONDUCTOR INTEGRATED CIRCUIT HAVING VOLTAGE GENERATION CIRCUIT DRIVEN BY TWO DIFFERENT CLOCK SIGNALS

BACKGROUND OF THE INVENTION

1. Field of the Invention

The present invention relates to a semiconductor integrated circuit, and more particularly to a semiconductor integrated circuit having a voltage generation circuit driven by two different clock signals.

2. Description of the Prior Art

Semiconductor integrated circuits with built-in memory (a single chip microcomputer) are currently in use in wide variety of fields such as electronic equipment and system control. The memories built in these semi-conductor integrated circuits are also of diverse kinds in response to required purposes, and are being used according to their respective characteristics.

Taking a ROM as an example of a memory for storing instruction codes and data in a single chip microcomputer, it can roughly be classified into two types; one is a mask ROM in which data to be written to the ROM (referred to as ROM codes hereinafter) are built during the process of manufacturing the semi-conductor chip, and the other is a programmable ROM (PROM) to which the user can write in arbitrary ROM codes after the manufacture of the semi-conductor chip. Generally speaking, if identical manufacturing technology is employed, it is possible to manufacture a mask ROM of smaller size in fewer steps than for a PROM, for ROMs of equal capacities.

Consequently, a single chip microcomputer with built-in mask ROM is adapted for mass production because its production in a large quantity beyond a certain number brings down the cost per unit piece. On the other hand, a single chip microcomputer with built-in PROM may be adapted for development and evaluation of programs and production in a small quantity because the user can arbitrarily write ROM codes to the ROM as the need arises and can manufacture as many as needed.

Although these two kinds of ROMs have respective features, basically, there are required ROMs with identical performance in the case of ROMs with built-in mask ROM as well as in the case of ROMs with built-in PROM. Since however, the PROM has a structure which is different from that of the mask ROM because of the fact that ROM codes are written after the completion of the diffusion process, the basic performance of these ROMs are mutually different, and gives rise to a result that the PROM is disadvantageous in such respects as the range of operating power supply voltage and the access speed. Accordingly, various circuitry contrivances have been proposed to compensate for these disadvantages of the PROM.

Referring to the drawings, the differences between the mask ROM and the PROM and contrivances on the PROM will now be described in the following.

Figure 3:
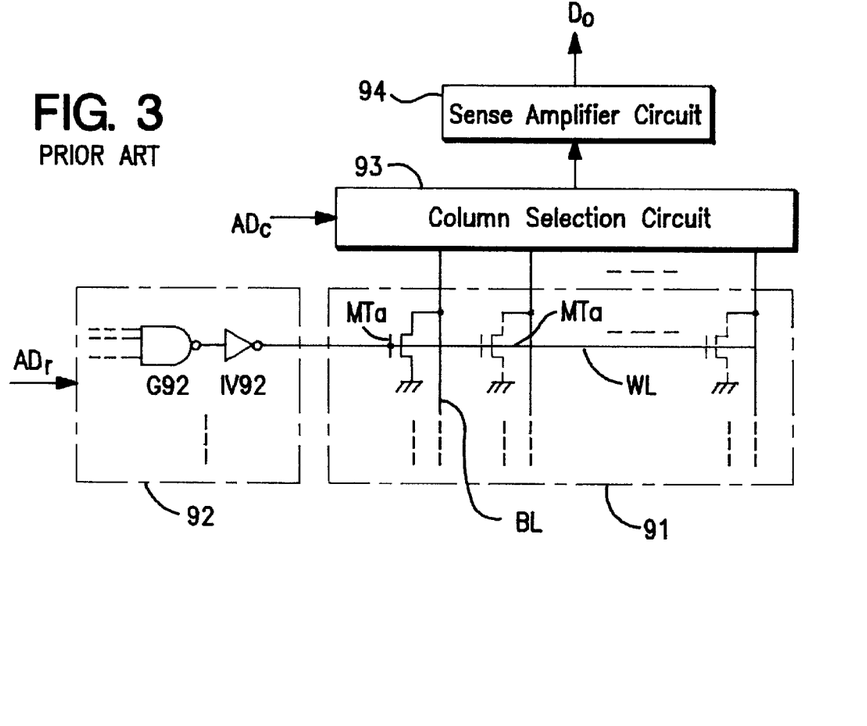
FIG. 3 is a circuit diagram showing an example of the mask ROM circuit included in the conventional semiconductor integrated circuit.

FIG. 3 is a circuit diagram showing the basic circuit configuration of the mask ROM.

This mask ROM is comprised of a memory cell array 91 which includes a plurality of memory cell transistors MTa, formed either as completed N-channel enhancement type transistors according to ROM codes by connecting their respective sources to ground potential points, or as transistors in an uncompleted state, arranged in a row direction and in a column direction, a plurality of word lines WL (only one of them being shown in FIG. 3) formed corresponding to respective rows (only one of them being shown in FIG. 3) of the plurality of memory cell transistors MTa, connected to the gates of the memory cell transistors MTa of the corresponding row and brings the memory cell transistors MTa of the corresponding row to selection state when the row is at a selection level, a plurality of bit lines BL formed corresponding to respective columns of the plurality of the memory cell transistors MTa and transmit data of the memory cell transistors MTa in the selection state of a corresponding column, a row selection circuit 92 which includes a plurality of logic gates G92 and inverters IV92 and brings one of the plurality of word lines WL to the selection level according to a row address signal ADr, a column selection circuit 93 which selects one out of the plurality of bit lines BL to the selection level according to a column address signal ADc, and a sense amplifier circuit 94 which detects the data transmitted to a selected bit line, and outputs a signal Do after amplification.

Here, it should be mentioned that the threshold voltage Vt of the completed N-channel enhancement type transistor out of the plurality of the memory cell transistors is about 0.7 V.

Data of the ROM code are determined according to whether an N-channel enhancement type transistor is formed or not. When a transistor is formed as a completed N-channel enhancement type transistor, this transistor is turned on as the word line WL goes to the selection level and a current flows in the sense amplifier circuit 94 via this transistor. On the contrary, when the corresponding memory cell transistor is not formed as a completed N-channel enhancement type transistor, no current will flow in the bit line BL even if the word line WL is brought to the selection level. The sense amplifier circuit 94 outputs "1" or "0" as the data output Do by detecting the presence or absence, respectively of such a current.

Figure 4A:
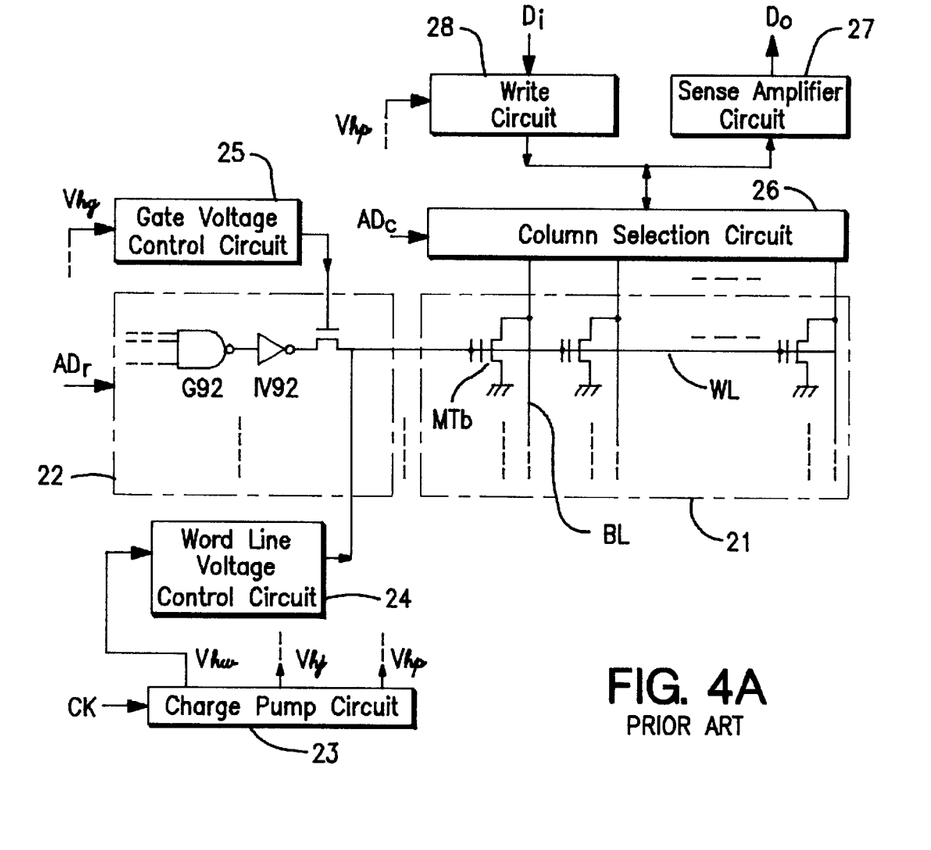
FIGS. 4(A) and 4(B) are a circuit diagram showing an example of the EPROM circuit included in the conventional semiconductor integrated circuit.
Figure 4B:
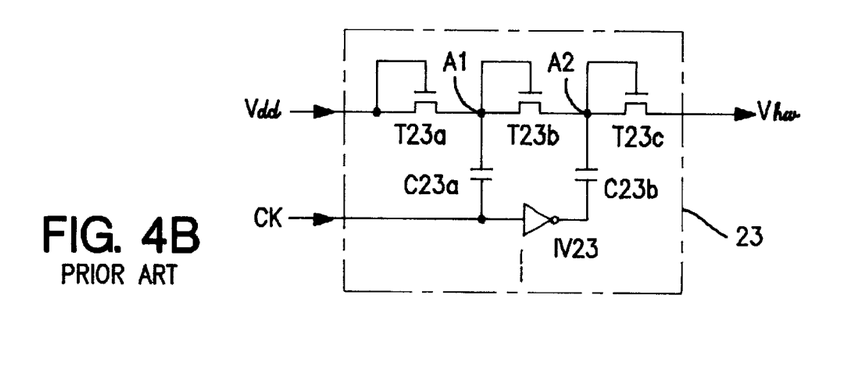

Next, referring to FIGS. 4(A) and 4(B), the basic circuit configuration of the PROM will be described by taking particularly the UV-erasable PROM (EPROM) as an example.

This EPROM differs from the mask ROM in the aspect that a memory cell transistor MTb is a transistor having a floating gate, and that it includes a circuit for electrically writing data to the memory cell transistor MTb. In this memory cell transistor MTb, its threshold voltage Vt varies according to the electric charge stored in the floating gate. A cell which is in the state of no stored charge (initial state or consumed state) is called an on-bit cell, and the threshold voltage Vt in this state is in the range of 2.5 to 3 V. Furthermore, when a negative charge is stored in the floating gate of a selected memory cell transistor by bringing the bit line BL and the word line WL to respective specified high voltages (Vhp and Vhw) by a write circuit 28 and a word line voltage control circuit 24, respectively, the threshold voltage Vt becomes about 9 V, and the cell in this state is called an off-bit cell.

Data for the ROM code is determined by the difference in the threshold voltage Vt due to the charge quantity in the floating gate of the memory cell transistor MTb. If the memory cell transistor MTb is in the state of an on-bit cell, this memory cell transistor MTb goes to the on-state when the word line WL goes to the selection level of about 5 V, and a current flows in a sense amplifier circuit 27 via this memory cell transistor. On the contrary, if the memory cell transistor MTb is in the state of an off-bit cell, no current will flow in the sense amplifier circuit 27 since the memory cell transistor is not energized even when the word line WL goes to the selection level. The sense amplifier circuit 27 outputs "1" or "0" as the data output Do by detecting the presence or absence of the flow of this current.

In bringing the word line WL to the high voltage (Vhw) level when writing to the memory cell transistor, transistor T22 of a row selection circuit 22 isolates the output of an inverter IV22 from the output of a word line voltage control circuit 24. At the time of writing, a voltage at least as high as the level of a threshold voltage Vtn of the transistor T22 is applied to the gate of the transistor T22 by a gate voltage control circuit 25. The output level of the inverter IV22 goes to a power supply voltage Vdd or the ground potential level according to the selection or nonselection of the memory cell transistor to which data are to be written. The word line voltage control circuit 24 always supplies the high voltage Vhw to the word line WL at the time of writing. At this time, the gate level of the transistor T22 goes to a negative level relative to the source level and the drain level so that the transistor T22 is not energized.

Accordingly, the level of the word line WL is pulled up to the level (Vhw) supplied by the word line voltage control circuit 24. On the other hand, at the time of nonselection, the output of the inverter IV22 goes to the ground potential level. In this case, a current flows between the source and the drain of the transistor T22 since its gate is at a level which is higher by at least the threshold voltage Vtn than the level of the source to which is applied the output of the inverter IV22, and the level of the word line WL is always pulled down to the ground potential level. Consequently, since at the time of non-selection the level of the word line WL does not go to the high voltage necessary for writing, the memory transistor cell does not go to the state of the off-bit cell regardless of the level of the bit line BL.

At the time of the read operation of the data in the memory cell transistor MTb, the word line voltage control circuit 24 is electrically isolated from the word line WL. The gate of the transistor T22 receives a voltage of a level (Vg) higher than (Vdd+Vtn) from the gate voltage control circuit 25. At the time of selection, the output of the inverter IV22 goes to the level of the power supply voltage Vdd. At this time, the gate of the transistor T22 is receiving a voltage of the level higher than the power supply voltage Vdd by at least its threshold voltage, so that this voltage is transmitted to the drain side without suffering a voltage drop relative to the power supply voltage Vdd, and brings the word line WL to the selection level of the power supply voltage Vdd level.

At the time of nonselection, the ground potential of the output of the inverter IV22 is transmitted through the transistor T22, which brings the word line WL to the nonselection level.

If it is assumed that the level of the gate of the transistor T22 is that of the power supply voltage Vdd, no particular difficulty will arise at the time of non-selection. However, at the time of selection, a voltage drop occurs corresponding to the threshold voltage of the transistor T22, with the selection level of the word line WL going up only to (Vdd−Vtn), which will cause problems with the access speed and the range of the operating power supply voltage. Therefore, in the normal read operation, it becomes necessary to apply a voltage which is higher than the power supply voltage Vdd by at least the threshold voltage Vtn to the gate of the transistor T22.

Now, normally a power supply voltage Vdd on the higher potential side and the ground potential are basically supplied to a semiconductor integrated circuit from the power unit. Accordingly, when high voltages (Vhg, Vhw and Vhp) higher than the power supply voltage Vdd are required as in the above, a booster circuit is installed internally to generate high voltages as needed. In the case of the PROM, a charge pump circuit is generally in widespread use, and it is also the case in the EPROM under discussion. A circuit diagram of a charge pump circuit 23 of this EPROM is shown in FIG. 4(B).

This charge pump circuit 23 is constituted of an N-channel transistor T23a which receives the power supply voltage Vdd to the source and the gate, an N-channel transistor T23b whose source and the gate are connected (at node A1) to the drain of the transistor T23a, an N-channel transistor T23c whose source and the gate are connected (at node A2) to the drain of the transistor T23b and has its drain as an output terminal of the high voltage Vhw, a capacitor C23a with its one end connected to the drain of the transistor T23a and receives a clock signal CK to the other end, an inverter IV23 which receives the clock signal CK at its input end, and a capacitor C23b whose one end is connected to the drain of the transistor T23b and whose the other end is connected to the output end of the inverter IV23. In FIG. 4(B), the high voltage Vhw alone is indicated explicitly, but other high voltages Vhg and Vhp are also output in a similar manner.

Next, the operation of the charge pump circuit 23 will be described.

First, a current flows from the node A1 to the node A2 when the clock signal CK is at the "1" level, namely, at the Vdd level. Next, as the clock signal CK goes to the "0" level, namely, to the ground potential level, the output of the inverter IV23 goes to "1" and the potential of the node A2 goes up due to the capacitive coupling of the capacitor C23b, and the high voltage Vhw is output through the transistor T23c. On the contrary, the potential of the node A1 tends to go down due to the capacitive coupling of the capacitor C23a, but a current is supplied through the transistor T23a. As the clock signal CK goes again to "1" the output of the inverter IV23 goes to "0" and because of this the potential of the node A2 tends to go down. On the contrary, since the potential of the node A1 goes up because of the capacitive coupling due to the capacitor C23a, the potential of the node A2 goes up higher than the level attained by the previous "1" level of the clock signal CK. In this manner, flow of a current from the side of the supply end of the power supply voltage Vdd to the side of the high voltage output end can be secured by the constant supply of the clock signal CK, and it is always possible to obtain at the high voltage output end a level of potential boosted by a specified amount relative to the power supply voltage Vdd. The time and the voltage before the high voltage Vhw reaches a desired level are determined by the capacitors C23a and C23b, a capacitor added to the high voltage output end and the clock frequency. As a clock signal source, an external source may be used if a clock signal with stabilized frequency can always be obtained, or it is necessary to obtain a stabilized clock signal internally by means of a self-oscillation circuit such as a ring oscillator if there is a possibility that a stabilized external clock signal cannot be obtained.

Figure 5:
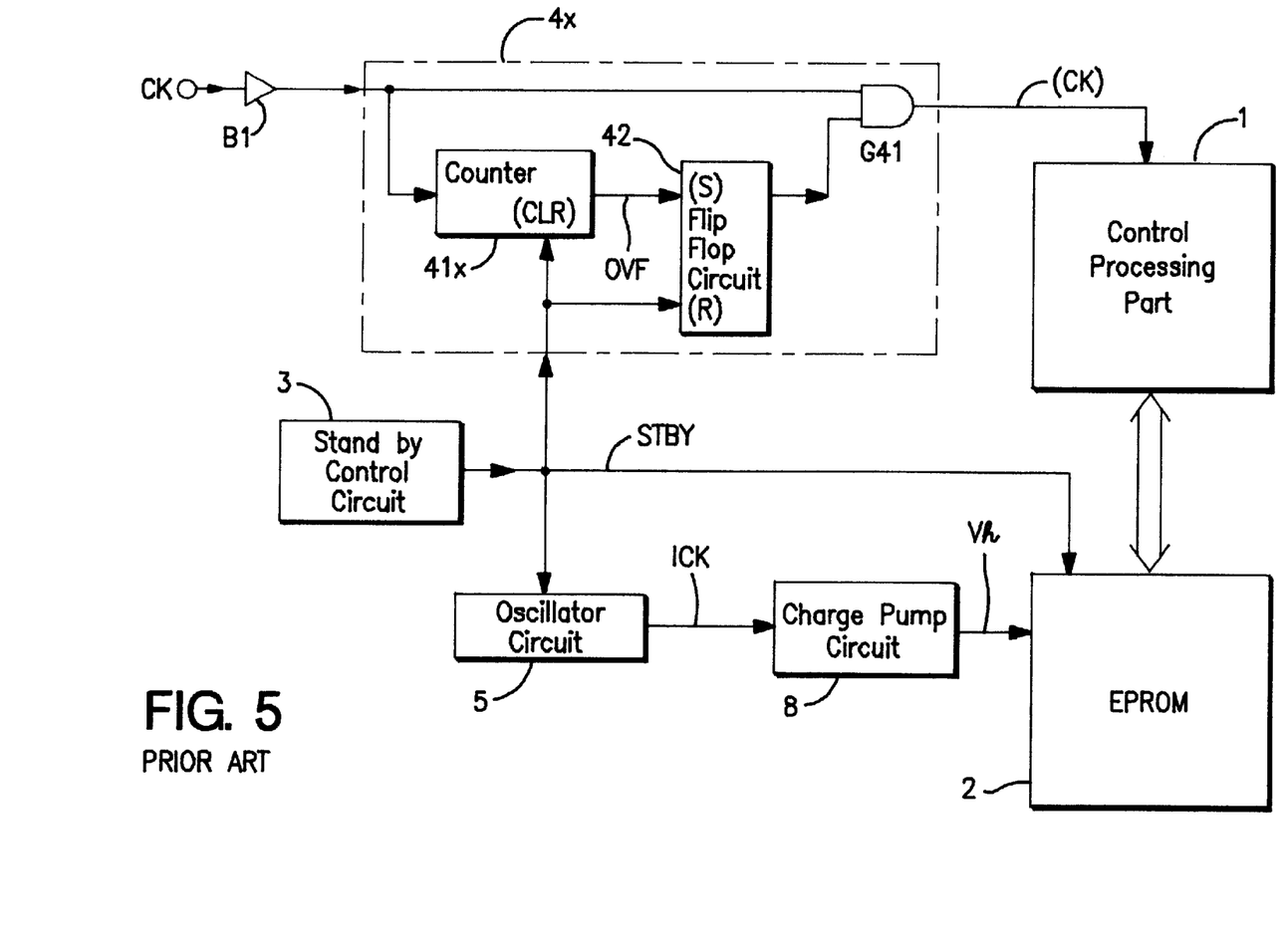
FIG. 5 is a block diagram showing a first example of the conventional semiconductor integrated circuit.

On the other hand, semiconductor integrated circuits which are used as systems by incorporating EPROM or the like, such as a single chip microcomputer, are required to be of low power consumption. Accordingly, it is general to equip the circuit with a so-called standby mode in which during the system stoppage state, the internal system clock is deactivated to bring the system to a condition where almost no current flows by cutting current paths if there exists paths which let currents flow in stationary manner. A block diagram of a single chip microcomputer with built-in EPROM and is equipped with standby mode, as a first example of such a semiconductor integrated circuit, is shown in FIG. 5.

This semiconductor integrated circuit is constituted of the following components: a central processing part 1 which indicates and controls the operation of various parts in accordance with a transmitted clock signal (CK) and executes a specified processing; an EPROM part 2 which carries out write and read operations of data in accordance with the indication and control of the central processing part 1 while receiving a high voltage Vh, and cuts the current path of a specified circuit in accordance with a standby signal STBY of active level; a standby control circuit 3 which outputs a standby signal STBY of active level at the time of standby mode; a buffer circuit B1 which buffer-amplifies a clock signal CK from the outside; a clock transmission control circuit 4x which is equipped with a counter 41x, a flip-flop circuit 42 and a logic gate G41, transmits the clock signal CK coming through the buffer circuit B1 to the central processing part 1 at the time of normal operation where the standby signal STBY is at the inactive level, stops the transmission of the clock signal CK to the central processing part 1 when the standby signal STBY goes to the active level, and resumes the transmission of the clock signal CK to the central processing part 1 at a specified time after the timing where the standby signal STBY changed to the inactive level; a self-oscillation circuit 5 which is oscillated at a specified frequency when the standby signal STBY is at the inactive level to output an internally oscillated clock signal ICK; and a charge pump circuit 8 which supplies a high voltage Vh with a potential higher than the power supply voltage Vdd by receiving the internally oscillated clock ICK from the self-oscillator circuit 5. The reasons for supplying the internally oscillated clock ICK to the charge pump circuit 8 by means of the self-oscillator circuit 5 is the following; namely, it is because there exists a possibility of having variations in the high voltage Vh due to the fact that the supply of the clock of stable and constant frequency to the charge pump circuit 8 may not be expected due to the possibility that the frequency of the clock signal input from the outside is varied, as a measure against power consumption, over a wide range from a specified frequency to the upper limit of the operable frequency.

Next, the operation of this semiconductor integrated circuit will be described.

When the system goes to the standby mode, a standby signal STBY of the active level is output from the standby control circuit 3, the flip-flop circuit 42 is reset to output a "0" level signal, and the output of the logic gate G41 is fixed at the "0" level. Accordingly, the transmission of the clock signal CK to the central processing part 1 is stopped to interrupt the operation of the central processing part 1, and the counter 41x is also kept cleared. Further, as the standby signal STBY goes to the active level, it is possible to set the system at the minimum power consumption condition by causing the self-oscillator circuit to stop the oscillation operation and the EPROM part 2 to cut the stationary current paths contained in the sense amplifier circuit or the like.

When the standby mode is released by, for example, an interruption input from an external interrupt terminal or the like (not shown), the standby signal STBY goes from the active level to the inactive level. Then, the clear condition of the counter 41x is released to start the counting operation of the clock signal CK input from the outside through the buffer circuit B1. Simultaneously, the self-oscillator circuit 5 starts the oscillation, the charge pump circuit 8 starts the boosting operation, and the stationary current paths existing in the EPROM part 2 are connected. Since, however, the flip-flop circuit 42 remains in the reset state until an overflow signal OVF is generated by the counter 41x, the output of the logic gate G41 remains fixed at the "0" level, and the central processing part 1 still continues the state of operation stoppage. When the counter 41x overflows, the flip-flop circuit 42 is set by a "1" level pulse of the overflow signal OVF. Then, the clock signal CK starts to be supplied from the logic gate G41, the central processing part 1 starts its operation to begin the access to the EPROM part 2.

The time from the start of the counting by the counter 41x due to transition of the standby signal STBY from the active level to the inactive level, to the generation of the overflow signal OVF is determined by the time from the release of the standby mode to access enable state of the EPROM part 2. More specifically, it is determined by the connection and settling time of the stationary current paths in the EPROM part 2 and the rise time of the output (Vh) of the charge pump circuit 8. However, the connection and settling time of the stationary current paths is on the order of several tens of nanoseconds which is almost negligibly small compared with the execution clock cycle of the system so that it is basically determined by the rise time of the output Vh of the charge pump circuit 8. This time is of the order of several tens to several hundreds of microseconds. The time of several tens of microseconds may be said to be a considerably long time for a system which operates with a clock cycle of several tens of nanoseconds. Accordingly, in the event where a fast response from the standby state is required, it is necessary to keep the charge pump circuit 8 operated constantly by the standby signal STBY without stopping the operation of the self-oscillator circuit 5. In this case, however, the power consumption has to be increased for that work, which defeats the purpose of the low current consumption mode.

Differing from the single chip microcomputer discussed so far, there is an example (see, for example, Japanese Unexamined Patent Application No. 1-241659 (1989)) in which the clock signal to the charge pump circuit 8 is obtained from a clock signal CK coming from the outside. In that case, it is prerequisite to keep inputting the clock signal CK from the outside in order to carry out the return from the standby state without delay, so that the clock signal CK is switched to a low frequency during the state of standby.

Figure 6:
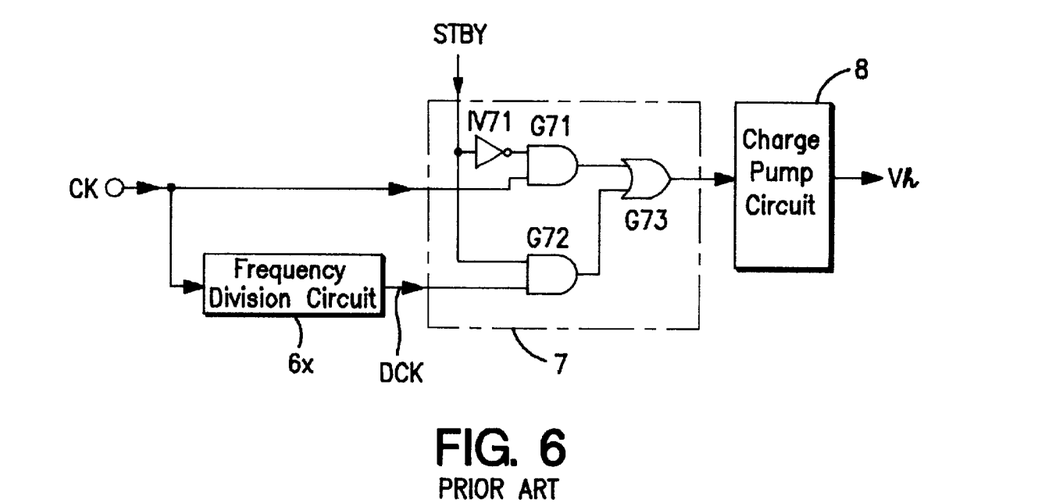
FIG. 6 is a circuit diagram showing a second example of the conventional semiconductor integrated circuit.

The charge pump circuit and the circuit portion related to its clock input of such an example (second example) of the semiconductor integrated circuit are shown in FIG. 6.

This semiconductor integrated circuit consists of a frequency division circuit 6x which divides the frequency of a clock signal CK from the outside into a specified frequency, and a switching circuit which is equipped with an inverter IV71 and logic gates G71 to G73, which supplies the divided clock signal DCK obtained by frequency division in the frequency division circuit 6x to the charge pump circuit 8 when the standby signal STBY is at the active level, and supplies the clock signal CK from the outside without change to the charge pump circuit 8 when the signal STBY is at the inactive level. The frequency division circuit 6x and the switching circuit 7 may replace the self-oscillator circuit 5 in FIG. 5, and the components other than these may or may not be the same as in the circuit in FIG. 5.

Next, the operation of this semiconductor integrated circuit will be described.

During the normal operation mode, the standby signal STBY is at the inactive level ("0" level), and the output of the inverter IV71 goes to the "1" level. Accordingly, the clock signal CK from the outside is transmitted through the logic gates G71 and G73 to the charge pump circuit 8, and the output of the logic gate G72 is fixed at the "0" level.

Next, when the system goes from the normal operation mode to the standby mode, the standby signal STBY goes from the "0" level to the "1" level and the output of the inverter IV71 goes to the "0" level. Consequently, the clock signal CK from the outside is fixed by the logic gate G71 at the "0" level, and the frequency divided clock signal DCK from the frequency division circuit 6x is transmitted to the charge pump circuit 8 through the logic gates G72 and G73.

In this way, in this semiconductor integrated circuit, during the standby mode, return to the normal operation mode from the standby mode is carried out without delay by continuously feeding the clock signal CK from the outside, and during the standby mode, the power consumption is reduced by lowering the frequency of the clock for driving the charge pump circuit 8.

Of the semiconductor integrated circuits described above, in the first example, the self-oscillator circuit 5 is stopped during the standby mode so that it is possible to reduce the power consumption, but it has a problem in that, at the time of return to the normal operation mode from the standby mode, the return takes a long time because of the long rise time required for the output voltage (Vh) of the charge pump circuit 8. In the second example, the charge pump circuit 8 is driven by the clock signal CK from the outside during the normal operation mode, and by a signal obtained by frequency dividing the clock signal CK from the outside during the standby mode. Therefore, it is possible to reduce the time for return to the normal operation mode while realizing the low power consumption during the standby mode. On the other hand, there exists a possibility of frequency change of the clock signal from the outside during the normal operation mode, and in the event of the frequency change, there arises a problem that the level of the high voltage Vh from the charge pump circuit 8 changes, which adversely affects the data write and read operations of the EPROM part 2.

SUMMARY OF THE INVENTION

An object of the present invention is to provide a semiconductor circuit which is capable of maintaining low power consumption during the standby mode and shorten the reset time or the recovery time from the standby mode to the normal operation mode, and is capable of obtaining a certain high voltage during the normal operation mode without being affected by the changes in the frequency of the external clock signal from the outside to obtain stable operational characteristics.

To achieve the above object, the semiconductor integrated circuit having a clock generation circuit generating a first clock signal, a dividing circuit receiving an external clock signal and outputting a second clock signal in accordance with said external clock signal, a switching circuit connected to said clock generation circuit and said dividing circuit and selectively outputting said one of said first and second clock signals in response to a control signal, a controller connected to said clock generation circuit and said switching circuit, receiving a mode signal, and outputting said control signal in accordance with said mode signal, said clock generation circuit being deactivated and said switching circuit selects said second clock signal in accordance with said control signal when said mode signal is in a first state, said switching circuit selecting said first clock signal in accordance with said control signal when said mode signal is in a second state, and a voltage generating circuit receiving said one of said first and second clock signals and generating a first voltage when said first clock signal is supplied through said switching circuit, and generating a second voltage when said second clock signal is supplied through said switching circuit.

Therefore, the voltage generation circuit generates the second voltage and the clock generation circuit is deactivated by the control signal when the mode signal is in the standby mode, thus the power consumption of the semiconductor integrated circuit is decreased so as to stop the operation of the oscillation circuit, and the reset time or recovery time of the voltage generation circuit is decreased so as to a voltage range from the second voltage to the first voltage is smaller than the voltage range from a zero voltage (a ground voltage) to the first voltage.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENT

Referring to the drawings, the embodiment of this invention will be described.

Figure 1:
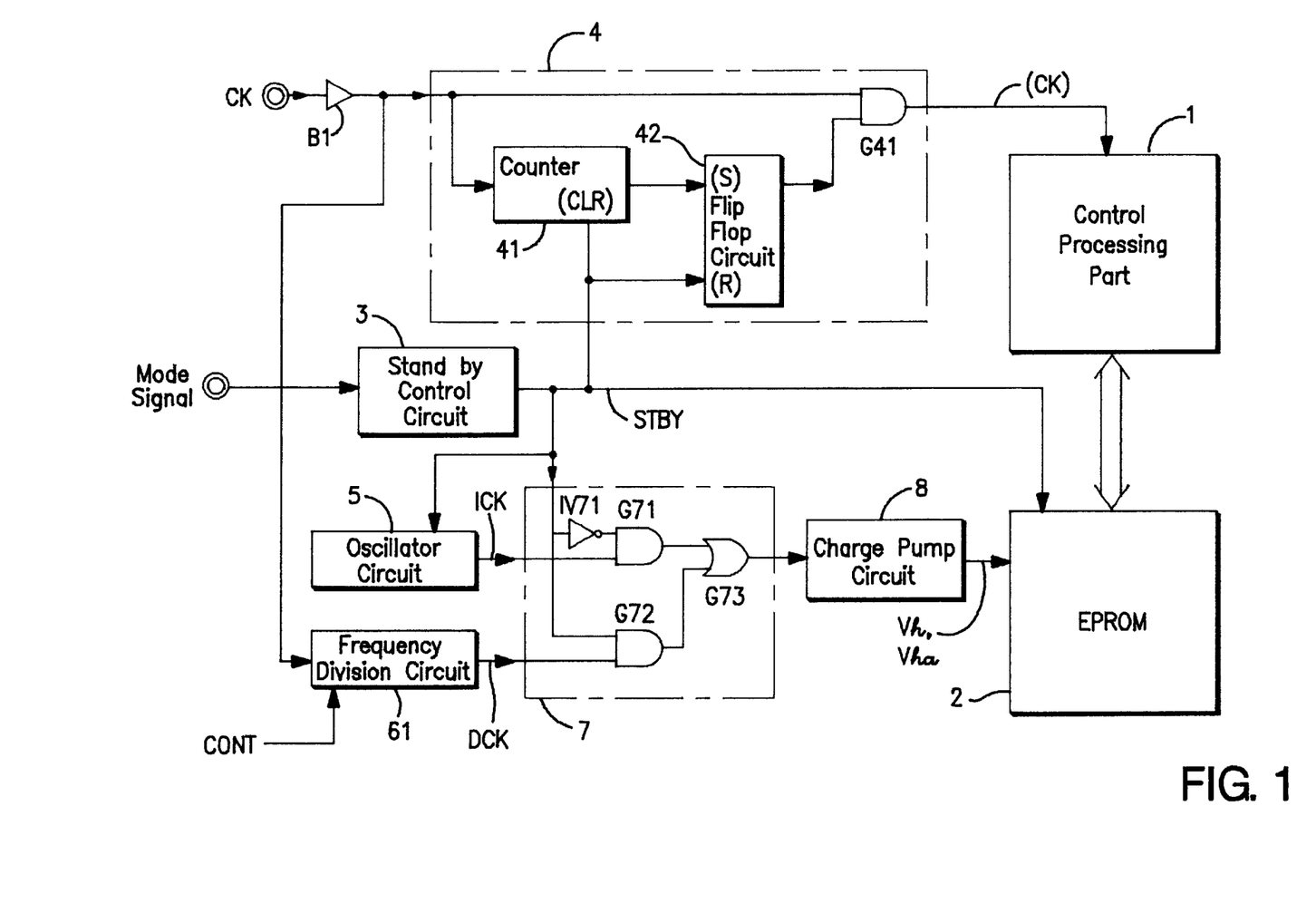
FIG. 1 is a block diagram showing an embodiment of the present invention.
Figure 2A:
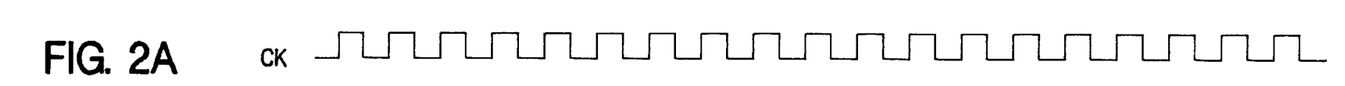
FIG. 2 is a timing chart showing the embodiment of the present invention.
Figure 2B:
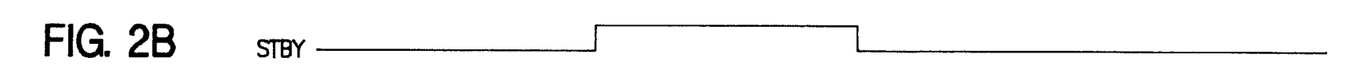
Figure 2C:
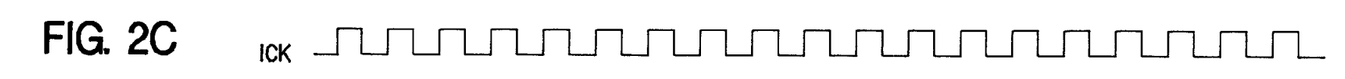
Figure 2D:
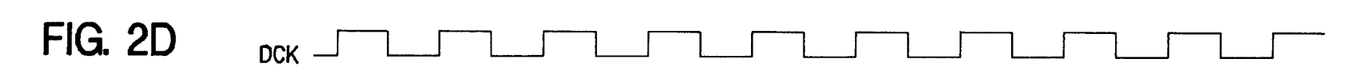
Figure 2E:
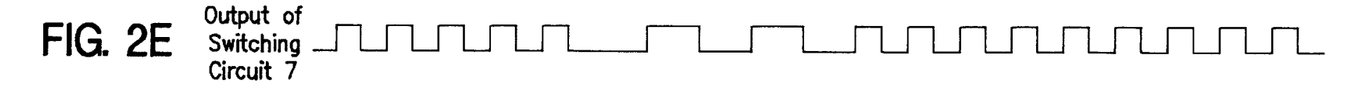
Figure 2F:
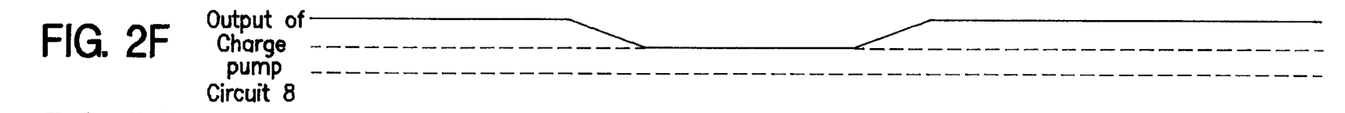
Figure 2G:
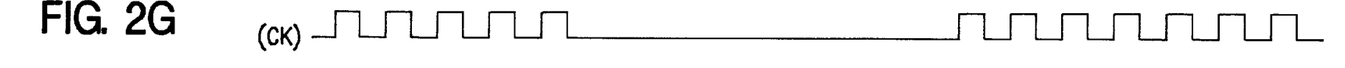
Figure 2H:
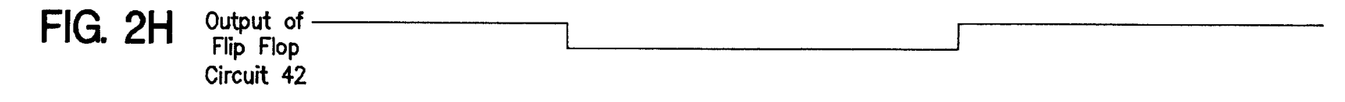

FIG. 1 is a block diagram showing an embodiment of this invention.

This embodiment includes: a central processing part 1, being one of internal circuits, which indicates and controls the operation of various parts and executes prescribed processings in accordance with a transmitted clock signal (CK); an EPROM part 2, being the other of the internal circuits, which carries out read and write operations of data by receiving a high voltage Vh and in accordance with the indication and control of the central processing part 1, and cuts a current path of a specified circuit in accordance with a standby signal STBY of active level; a standby control circuit 3 which outputs a standby signal STBY of active level during the standby mode in response to a mode signal (for example, the mode signal is provided from an external circuit) a buffer circuit Bi which buffer amplifies a clock signal CK supplied from an external clock generation circuit provided outside of this semiconductor integrated circuit; a clock transmission control circuit 4 which is equipped with a counter 41, a flip-flop circcuit 42 and a logic gate G41, transmits the clock signal CK from the outside supplied through the buffer circuit B1 during the normal operation mode where the standby signal STBY is at the inactive level, stops the transmission of the clock signal CK to the central processing part 1 when the standby signal STBY goes to the standby mode of the active level, and resumes the transmission of the clock signal CK to the central processing part 1 at a time after a specified length of time from the timing where the standby signal STBY changes to the inactive level; a self-oscillator circuit 5 which is oscillated at a specified frequency to output an internally oscillated clock signal ICK when the standby signal STBY is at the inactive level; a frequency division circuit 61 which divides the frequency of the clock signal CK from the outside sent through the buffer circuit B1 in accordance with a dividing number inputted by a division control signal CONT to output a frequency divided clock signal DCK; a switching circuit 7 which is equipped with an inverter IV71 and logic gates G71 to G73 and selects the frequency divided clock signal DCK when the standby signal STBY is at the active level and selects the internally oscillated clock signal ICK when it is at the inactive level; and a charge pump circuit 8 which receives the clock signal selected by the switching circuit 7 and supplies a high voltage vh having a potential higher than the power supply voltage Vdd and a voltage Vha which is equivalent to or lower than the high voltage Vh.

Next, referring FIGS. 1 and 2, the operation of this embodiment will be described.

During t he normal operation mode, the standby signal STBY is at "0" level of the inactive level. In this case, the output of the inverter IV71 of the switching circuit 7 is at the "1" level so that the internally oscillated lock signal ICK is transmitted through the logic gate G71 to the logic gate G73. On the other hand, the output of the logic gate G72 is fixed at the "0" level so that the internally oscillated clock signal ICK is supplied to the charge pump circuit 7 from the output end of the logic gate G73, namely, the switching circuit 7. Besides, the clock transmission control circuit 4 transmits the clock signal CK from the outside coming through the buffer circuit B1 to the central processing part 1, and the various parts including the EPROM part 2 are operated under the indication and control of the central processing part 1. The operation in this case is similar to that of the prior art shown in FIG. 4.

As the operating mode goes from the normal operation mode to the standby mode, the standby control circuit 3 detects the transition and changes the standby signal STBY to the "1" level of the active level. As a result, in the clock transmission control circuit 4, the flip-flop circuit 42 is reset and the output of the logic gate G41 is fixed to the "0" level to stop the transmission of the clock signal CK to the central processing part 1, and the operation of the central processing part 1 is stopped. In addition, the counter 41 is kept cleared by the signal STBY "1". Besides, the self-oscillator circuit 5 stops the oscillation, and the EPROM part 2 goes to the low power consumption state by cutting the stationary current paths contained in the sense amplifier circuit and the like. Further, in the switching circuit 7, the frequency divided clock signal DCK obtained in the frequency division circuit 61 by dividing the frequency of the clock signal from the outside is selected to be supplied to the charge pump circuit 8, and the charge pump circuit 8 outputs a voltage Vha which is equal to or lower than the high voltage Vh.

Because, an ability of the charge pump circuit depends on the frequency of the inputted clock signal, therefore, the output voltage Vha of the charge pump circuit is equal to or lower than the voltage Vh when the frequency of the inputted clock signal become lower as shown in FIG. 2. However, FIG. 2 shows the voltage Vha is lower than the voltage Vh.

As the operation mode makes a transition from the standby mode to the normal operation mode, the standby control circuit 3 detects it and sets the standby signal STBY at the inactive level of "0" level. As a result, the switching circuit 7 selects the internally oscillated clock signal ICK from the self-oscillator circuit 5 to supply it to the charge pump circuit 8, and upon receipt of the signal the charge pump circuit 8 generates a high voltage Vh to supply it to the EPROM part 2. Further, in the clock transmission control circuit 4, the clear condition of the counter 41 is released to start counting and, with the output of the overflow signal OVF at a specified length of time later in this case, the counter 41 counts 3 clocks of the clock signal CK, sets the flip-flop circuit 4, transmits the clock signal CK from the outside to the central processing part 1 from the logic gate G41, and resumes the normal operation.

In this embodiment, during the normal operation mode, the charge pump circuit 8 is driven by the internally oscillated clock signal ICK from the self-oscillator circuit 5. Accordingly, it is always possible to supply the high voltage Vh of a constant potential to the EPROM part 2 without being affected by the change in the frequency of the clock signal CK from the outside, and keep the operating characteristics of the EPROM part 2 constant. Moreover, during the standby mode, the charge pump circuit 8 is kept driven by the frequency divided clock signal DCK from the frequency division circuit 61. Therefore, the rise time of the high voltage Vh from the charge pump circuit 8 at the time of transition to the normal operation mode can be made negligible or very small, and decrease the reset time to the normal operation mode (make the counted value of the counter 4 until the overflow small). Furthermore, the self-oscillator circuit 5 composed of a ring oscillator or the like has a relatively high current consumption, but the frequency division circuit 61 composed of a flip-flop circuit or the like has a small current consumption, so that it is possible to reduce the power consumption during the standby mode by the amount corresponding to the difference between the two current consumptions.

In addition, by making the frequency of the frequency divided clock signal DCK obtained in the frequency division circuit 61 in accordance with the signal CONT lower than the frequency of the internally oscillated clock signal ICK obtained in the self-oscillator circuit 5, it is possible to further reduce the power consumption. However, in this case, the output voltage Vha of the charge pump circuit 8 is also lowered and the transition time to the normal operation mode is prolonged accordingly, so that it is necessary to determine the amount of reduction of the frequency by considering the trade-off between the reduction in the power consumption and the decrease in the transition time. For example, in standby mode, the EPROM 2 does not need high driving ability, because the EPROM 2 does not operating, therefore, the charge pump circuit can supply the voltage Vh in accordance with the clock signal DCK.

Besides, as a method of further reduction of the power consumption there may be mentioned a method of stopping the supply of the clock signal CK from the outside for a specified period of time during the standby mode.

In that case, the semiconductor integrated circuit according to this embodiment is driven as in the following.

First, as the system goes to the standby mode, the supply of the clock signal CK from the outside is stopped. Then, in the transition from the standby mode to the normal operation mode, transition to the normal operation mode is arranged to take place after resumption of the supply of the clock signal CK from the outside at a specified timing prior to the actual transition to the normal operation mode. The timing of the resumption of the supply of the clock signal CK from the outside is determined by the rise time of the high voltage Vh in the charge pump circuit 8.

By selecting such a driving method, all of the circuit operations can be stopped over the period from th e time of going to the standby mode to the resumption of the supply of the clock signal CK from the outside, so that it is possible to further reduce the power consumption accordingly. Moreover, in making the transition to the normal operation mode, the transition time to the normal operation mode can be decreased since the high voltage Vh has sufficiently risen by that time.

In this embodiment, the internal circuit is assumed to be a circuit consisting of the central processing part 1 and the EPROM part 2, but it may be replaced by another circuit.

For example, the EPROM part can replace EEPROM. Furthermore, the EPROM part can replace a dynamic RAM (DRAM) and the charge pump circuit can replace another charge pump circuit for generating a back bias voltage of the DRAM for stabilizing a read and write operation of the DRAM. Thus, the present invention can apply to many circuits which request a voltage higher or lower than a supplied high voltage Vcc or a supplied low voltage GND for operating.

As described in the above, this invention has a constitution by which during the normal operation mode the charge pump circuit is driven by the output signal of the self-oscillator circuit, so that it is possible to obtain a stabilized operating characteristics since a constant high voltage can be secured even if the frequency of the clock signal from the outside changes. Moreover, a configuration is adopted by which during the standby mode the charge pump circuit is driven by the clock signal from the outside by stopping the operation of the self-oscillator circuit, so that it is possible to reduce the power consumption in proportion to the difference of the power consumption between the circuits for driving the charge pump circuit. Besides, it is possible to further reduce the power consumption by stopping the supply of the clock signal from the outside for a specified period of time during the standby mode. Furthermore, at the time of transition from the standby mode to the normal operation mode, the charge pump circuit is already driven and the high voltage is raised to a sufficiently high level, so that the reset time (transition time) to the normal operation mode can be decreased.

While this invention has been described in conjunction with a certain preferred embodiment, it is to be understood that the subject matter encompassed by way of this invention is not to be limited to the specific embodiment. On the contrary, it is intended for the subject matter of the invention to include all alternatives, modifications and equivalents as can be included within the spirit and scope of the following claims.

What is claimed is:

1. A semiconductor integrated circuit having a normal mode for a normal processing state and a stand-by mode for a low power consumption state comprising:

a clock generation circuit for generating, when activated, a first clock signal, and stopping, when deactivated, generating said first clock signal;

a terminal receiving an external clock signal;

a transmitting circuit receiving said external clock signal and outputting a second clock signal in accordance with said external clock signal;

a switching circuit connected to said clock generation circuit and said transmitting circuit to receive said first and second clock signals;

a voltage generating circuit receiving a third clock signal and generating a voltage in response thereto; and a controller connected to said clock generating circuit and said switching circuit and receiving a mode signal taking one of said normal mode and said stand-by mode, said controller controlling said switching circuit to select and output said first clock signal as said third clock signal in response to said normal mode of said mode signal, and said controller controlling said switching circuit to select and output said second clock signal as said third clock signal and deactivating said clock generating circuit in response to said stand-by mode of said mode signal.

2. The circuit as claimed in claim 1, wherein said transmitting circuit divides said external clock signal in accordance with a predetermined value for generating said second clock signal.

3. The circuit as claimed in claim 1, wherein a frequency of said first clock signal is larger than that of said second clock signal.

4. The circuit as claimed in claim 1, wherein said voltage generating circuit is a charge pump circuit.

5. A semiconductor integrated circuit having a normal mode for a normal processing state and a stand-by mode for a low power consumption state comprising:

a clock generation circuit generating a first clock signal during said normal mode and stopping during said stand-by mode;

a frequency dividing circuit receiving an external clock signal and outputting a second clock signal in accordance with said external clock signal;

a switching circuit connected to said clock generation circuit and said dividing circuit and selectively outputting said one of said first and second clock signals in response to a control signal;

a controller connected to said clock generation circuit and said switching circuit, receiving a mode signal including one of said normal mode and said stand-by mode, and outputting said control signal in accordance with said mode signal, said clock generation circuit being deactivated and said switching circuit selects said second clock signal in accordance with said control signal when said mode signal indicates said stand-by mode, said switching circuit selecting said first clock signal in accordance with said control signal when said mode signal indicates said normal mode;

an internal circuit;

a transmission control circuit transmitting said external clock signal to said internal circuit when said control signal is in said second state for operating said internal circuit, and stopping transmitting said external clock signal to said internal circuit for stopping operating said internal circuit when said mode signal indicates said stand-by mode; and a voltage generating circuit receiving said one of said first and second clock signals and generating a first voltage when said first clock signal is supplied through said switching circuit, and a second voltage when said second clock signal is supplied through said switching circuit.

6. The circuit as claimed in claim 5, wherein a frequency of said first clock signal is larger than that of said second clock signal.

7. The circuit as claimed in claim 5, wherein said voltage generating circuit is a charge pump circuit.

8. The circuit as claimed in claim 5, wherein said internal circuit has a central processing part receiving said external clock signal when said control signal is in said first and second state and an EPROM part receiving said first voltage when said control signal is in said second state and receiving said second voltage when said control signal is in said first state.

* * * * *